United States Patent
Okura et al.

(10) Patent No.: US 11,929,454 B2
(45) Date of Patent: Mar. 12, 2024

(54) LIGHT EMITTING DEVICE INCLUDING ELECTRONIC COMPONENTS AND PIN HOLES

(71) Applicant: NICHIA CORPORATION, Anan (JP)

(72) Inventors: Shinya Okura, Anan (JP); Takanobu Sogai, Anan (JP); Koji Oshodani, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/345,335

(22) Filed: Jun. 11, 2021

(65) Prior Publication Data
US 2021/0305467 A1  Sep. 30, 2021

Related U.S. Application Data

(63) Continuation of application No. 16/517,109, filed on Jul. 19, 2019, now Pat. No. 11,063,187.

(30) Foreign Application Priority Data

Jul. 20, 2018 (JP) .............................. JP2018-136824

(51) Int. Cl.
*H01L 33/50* (2010.01)
*H01L 25/075* (2006.01)
(Continued)

(52) U.S. Cl.
CPC .......... *H01L 33/502* (2013.01); *H01L 33/505* (2013.01); *H01L 33/52* (2013.01);
(Continued)

(58) Field of Classification Search
CPC ..... H01L 33/502; H01L 33/505; H01L 33/52; H01L 33/62; H01L 25/0753;
(Continued)

(56) References Cited

U.S. PATENT DOCUMENTS

| 11,063,187 B2 * | 7/2021 | Okura .................... H01L 33/52 |
| 2011/0128304 A1 | 6/2011 | Takaoka |

(Continued)

FOREIGN PATENT DOCUMENTS

| JP | 2010-157486 A | 7/2010 |
| JP | 2011-119387 A | 6/2011 |

(Continued)

OTHER PUBLICATIONS

Notice of Allowance on U.S. Appl. No. 16/517,109 dated Mar. 19, 2021.

(Continued)

*Primary Examiner* — Patricia D Valenzuela
(74) *Attorney, Agent, or Firm* — Foley & Lardner LLP

(57) ABSTRACT

A light emitting device includes: a base member having a first surface including a first region and a second region; a first frame provided on the base member and surrounding the first region; a light emitting element provided on the base member in the first region; a light-transmissive first member provided inward of the first frame, and covering the light emitting element; an electronic component provided on the base member in the second region and electrically connected with the light emitting element; and a plurality of pin holes arrayed in a first direction and electrically connected with the electronic component, the first direction being orthogonal to a thickness direction of the base member. The electronic component is provided on a side opposite the plurality of pin holes with respect to the light emitting element in a second direction that is orthogonal to the thickness direction and the first direction.

20 Claims, 9 Drawing Sheets

(51) Int. Cl.
  *H01L 33/36* (2010.01)
  *H01L 33/38* (2010.01)
  *H01L 33/46* (2010.01)
  *H01L 33/52* (2010.01)
  *H01L 33/62* (2010.01)
  *H05B 45/40* (2020.01)
  *H01L 25/16* (2023.01)
  *H01L 33/54* (2010.01)
  *H01L 33/58* (2010.01)

(52) U.S. Cl.
  CPC ............ *H01L 33/62* (2013.01); *H05B 45/40* (2020.01); *H01L 25/0753* (2013.01); *H01L 25/167* (2013.01); *H01L 33/36* (2013.01); *H01L 33/38* (2013.01); *H01L 33/46* (2013.01); *H01L 33/504* (2013.01); *H01L 33/54* (2013.01); *H01L 33/58* (2013.01); *H01L 2224/48137* (2013.01)

(58) Field of Classification Search
  CPC ....... H01L 25/167; H01L 33/54; H01L 33/36; H01L 33/38; H01L 33/504; H01L 33/46; H01L 33/58; H01L 2224/48137; H05B 45/40; H05B 45/397; Y02B 20/30
  See application file for complete search history.

(56) References Cited

U.S. PATENT DOCUMENTS

| | | | |
|---|---|---|---|
| 2012/0098458 | A1 | 4/2012 | Dai et al. |
| 2013/0113015 | A1 | 5/2013 | Kimura et al. |
| 2013/0194795 | A1 | 8/2013 | Onaka et al. |
| 2014/0175595 | A1 | 6/2014 | Oka |
| 2015/0188004 | A1* | 7/2015 | Ozeki ............... H01L 33/508 438/27 |
| 2015/0262987 | A1* | 9/2015 | Wada ............... H01L 29/866 438/27 |
| 2016/0245470 | A1 | 8/2016 | Hatanaka et al. |
| 2016/0276553 | A1* | 9/2016 | Okubo ............... H01L 25/0753 |
| 2017/0009953 | A1 | 1/2017 | Kosugi et al. |
| 2017/0154880 | A1* | 6/2017 | Ozeki ............... H01L 33/0095 |
| 2017/0162768 | A1* | 6/2017 | He ............... H01L 33/62 |
| 2017/0236982 | A1 | 8/2017 | Akiyama et al. |
| 2017/0268753 | A1 | 9/2017 | Tajiri et al. |
| 2017/0343180 | A1 | 11/2017 | Ishiyama et al. |
| 2018/0106448 | A1 | 4/2018 | Shiraishi |
| 2020/0271308 | A1 | 8/2020 | Yasutake |

FOREIGN PATENT DOCUMENTS

| | | |
|---|---|---|
| JP | 2012-094866 A | 5/2012 |
| JP | 2013-115368 A | 6/2013 |
| JP | 2013-222782 A | 10/2013 |
| JP | 2014-143396 A | 8/2014 |
| JP | 2015-220035 A | 12/2015 |
| JP | 2016-106350 A | 6/2016 |
| JP | 2017-021988 A | 1/2017 |
| JP | 2017-139404 A | 8/2017 |
| JP | 2017-168207 A | 9/2017 |
| JP | 2017-168274 A | 9/2017 |
| JP | 2017-174798 A | 9/2017 |
| JP | 2017-212166 A | 11/2017 |
| JP | 2017-224466 A | 12/2017 |
| JP | 2018-063851 A | 4/2018 |
| JP | 2018-085300 A | 5/2018 |
| JP | 2020-004688 A | 1/2020 |
| WO | WO-2016/052550 A1 | 4/2016 |

OTHER PUBLICATIONS

U.S. Office Action on U.S. Appl. No. 16/517,109 dated Nov. 25, 2020.

Transistor Technology Editorial Department, "Practical Electronic Circuit Handbook (1)", 33rd Edition, Japan, CQ Publishing Co., Ltd., Mar. 10, 1990, pp. 375-377.

Non-Final Office Action in U.S. Appl. No. 18/184,752 dated Oct. 12, 2023.

* cited by examiner

LIGHT EMITTING DEVICE INCLUDING ELECTRONIC COMPONENTS AND PIN HOLES

CROSS-REFERENCE TO RELATED APPLICATIONS

This application is a continuation of U.S. patent application Ser. No. 16/517,109, filed on Jul. 19, 2019, which claims priority to Japanese Patent Application No. 2018-136824, filed on Jul. 20, 2018, the disclosures of which are hereby incorporated by reference in their entireties.

BACKGROUND

The present disclosure relates to a light emitting device.

Light emitting devices are known in which a light emitting element and an electronic component are mounted on a base member. By mounting light emitting elements and electronic components on one base member, a light emitting device can be reduced in size as compared to a case where such components are separately provided, and connected. It is desired to improve the light extraction efficiency of the light emitting device. (See, for example, Japanese Patent Publication No. 2017-139404.)

SUMMARY

One object of the present disclosure is to provide a light emitting device with improved light extraction efficiency.

A light emitting device according to one aspect of the present disclosure includes: a base member having a first surface including a first region and a second region; a first frame provided on the base member and surrounding the first region; a light emitting element provided on the base member while being in the first region; a light-transmissive first member provided inward of the first frame, and covering the light emitting element; a second frame provided on the base member and surrounding the second region; an electronic component provided on the base member while being in the second region; and a non-light-transmissive second member provided inward of the second frame and covering the electronic component. A part of the first frame and a part of the second frame are integrated with each other. An upper surface of the first member is positioned higher than an upper surface of the first frame, an upper surface of the second frame, and an upper surface of the second member.

According to certain embodiments of the present disclosure, the light extraction efficiency of a light emitting device can be improved.

DETAILED DESCRIPTION

Figure 1:
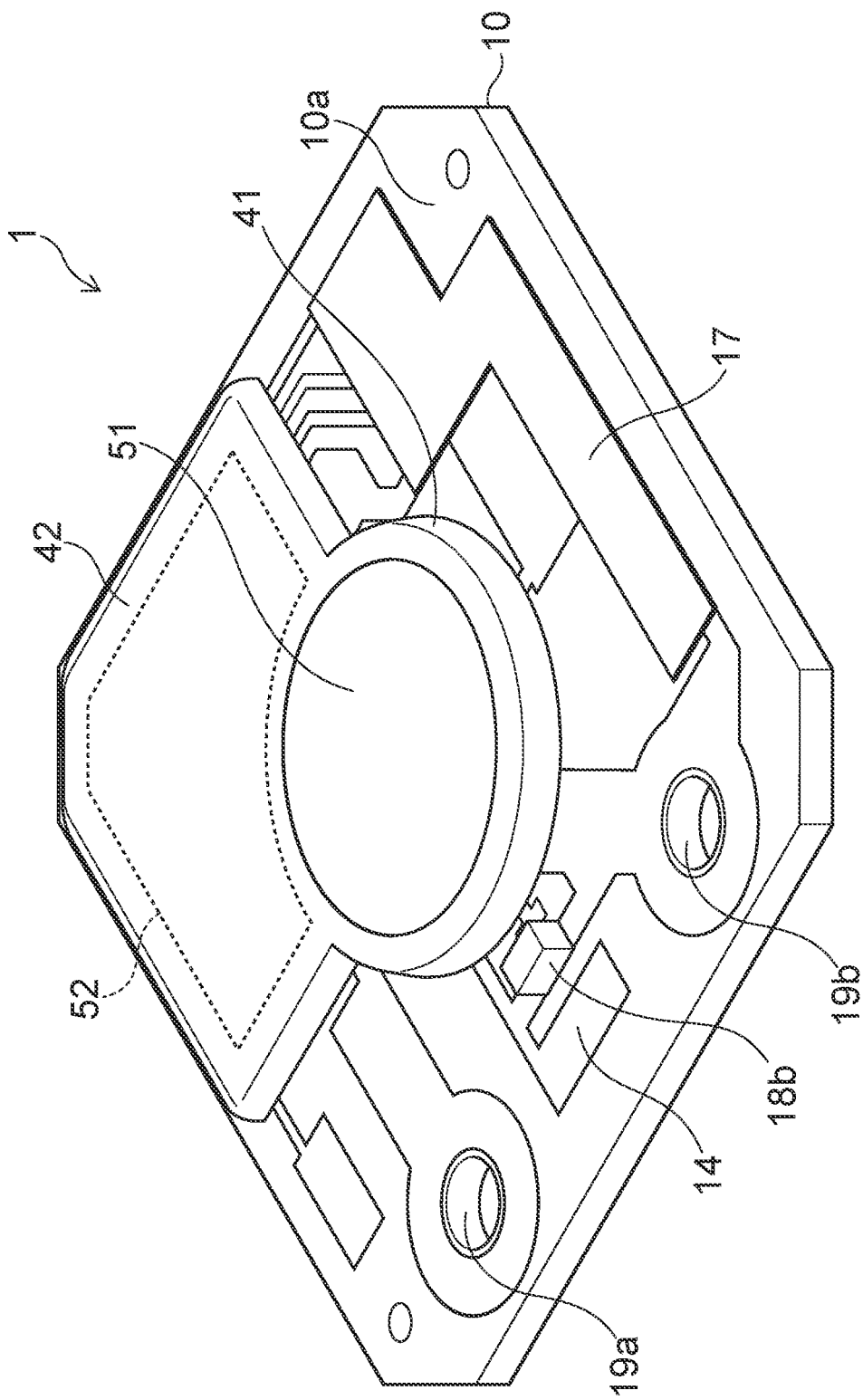
FIG. 1 is a perspective view illustrating a light emitting device according to an embodiment.

Hereinafter, embodiments of the present disclosure will be described with reference to the drawings. In the drawings, the same reference numerals are assigned to the same constituent elements, and repeated descriptions thereof are omitted as appropriate.

Figure 2:
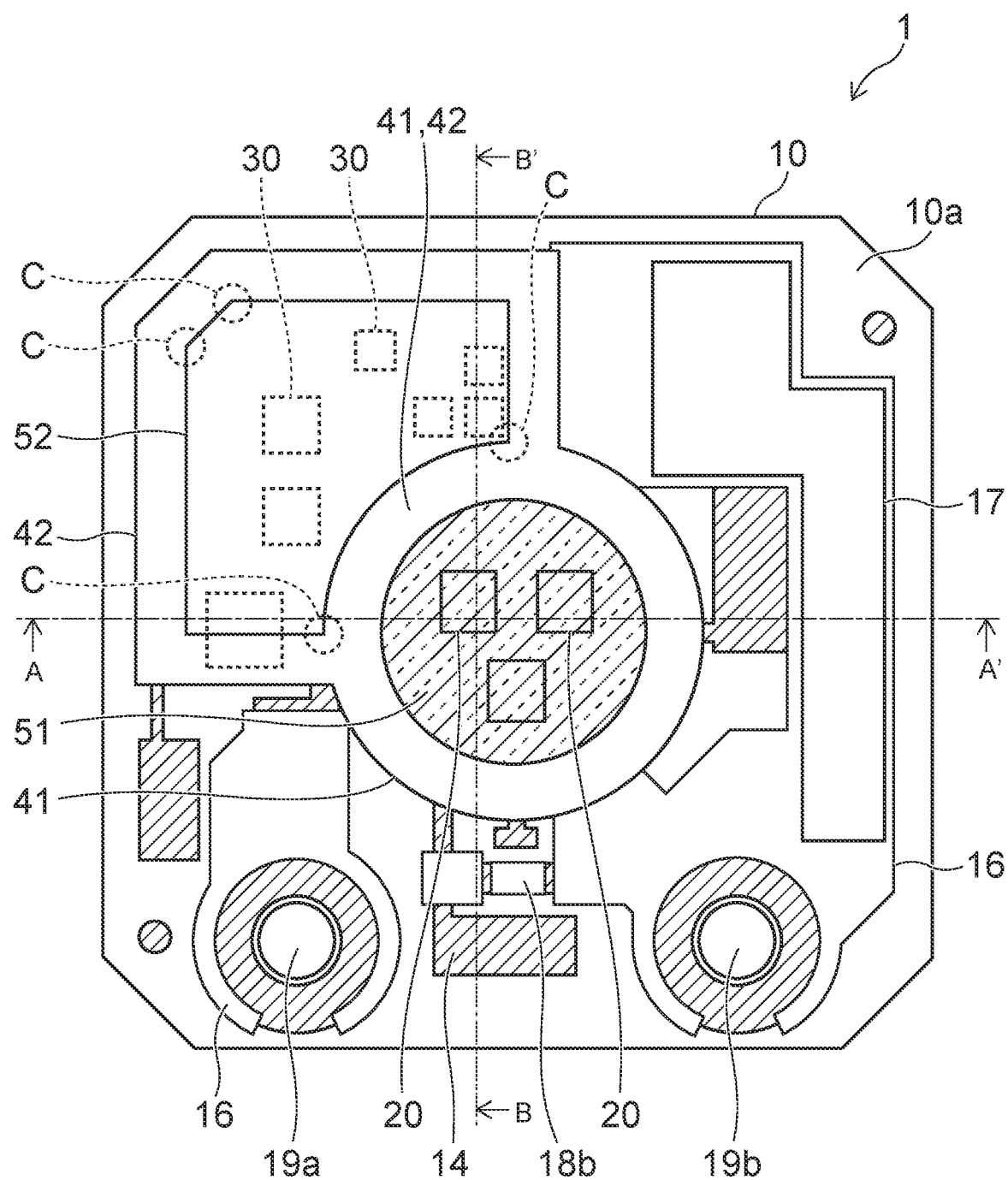
FIG. 2 is a top view illustrating the light emitting device according to the embodiment.
Figure 3:
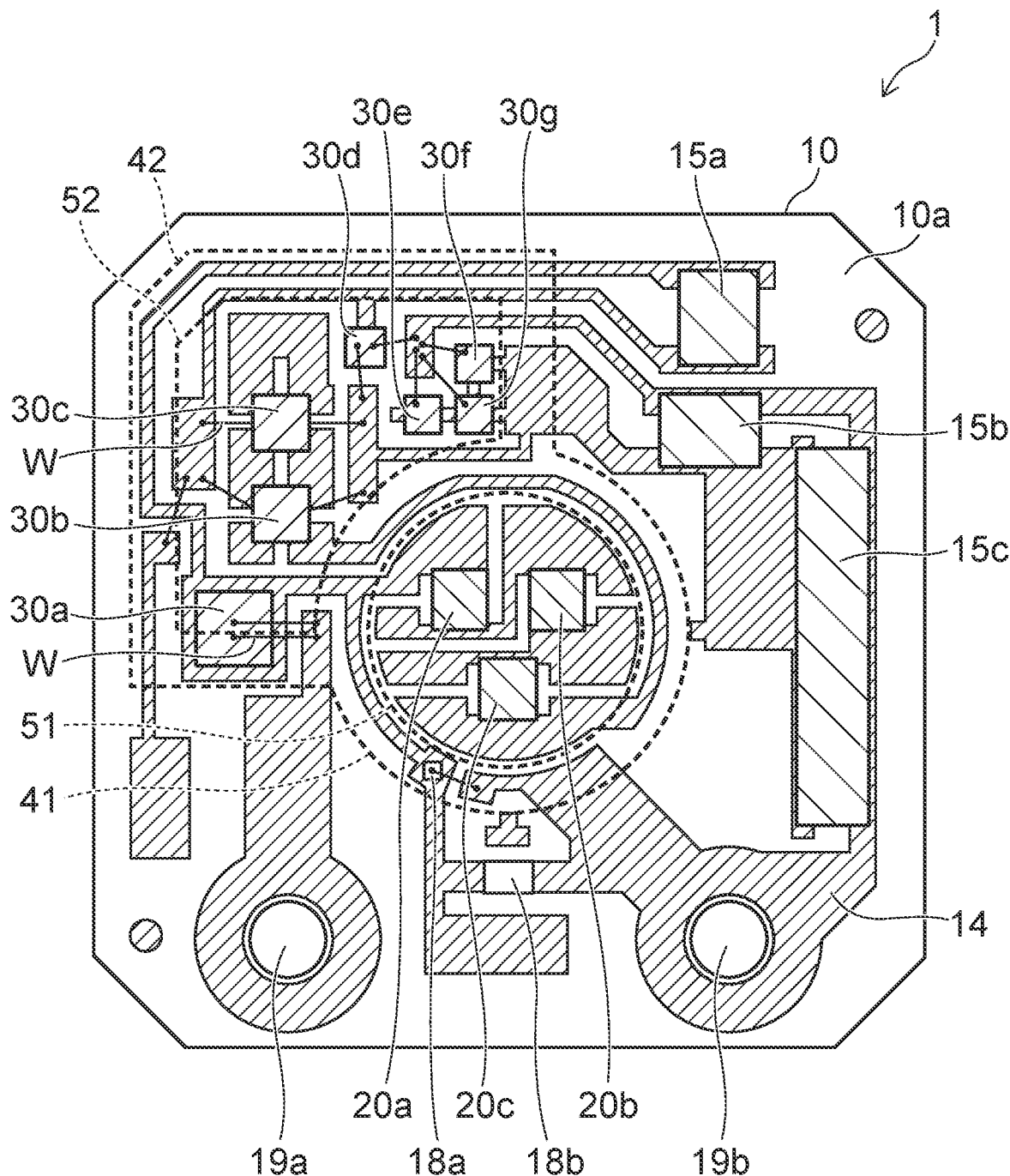
FIG. 3 is a top view illustrating the light emitting device according to the embodiment.
Figure 4:
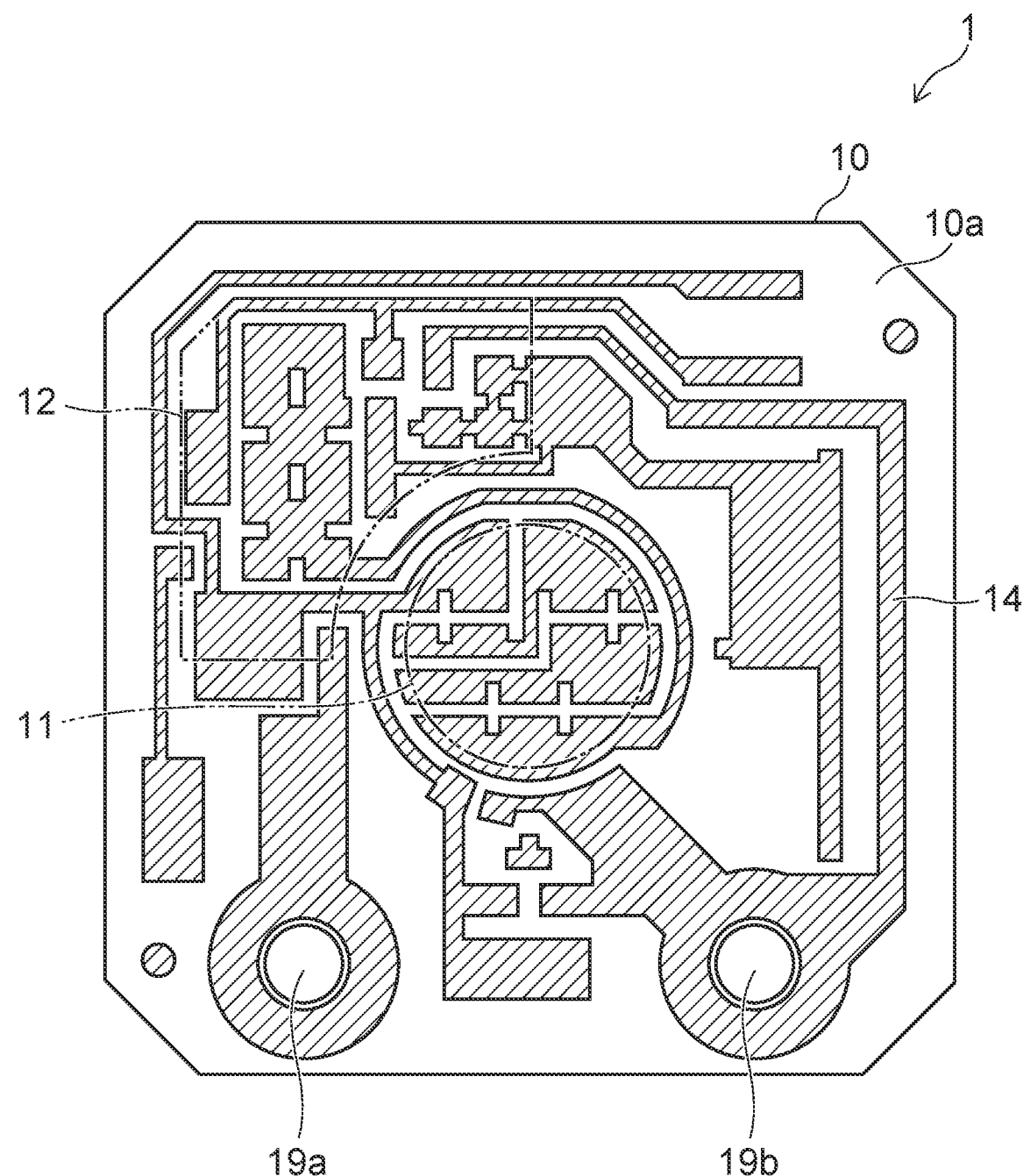
FIG. 4 is a top view illustrating a base member of the light emitting device according to the embodiment.

FIG. 1 is a perspective view illustrating a light emitting device according to the embodiment.
FIGS. 2 and 3 are top views illustrating the light emitting device according to the embodiment.
FIG. 4 is a top view illustrating a base member of the light emitting device according to the embodiment.
FIG. 3 is a diagram in which some constituent elements are omitted or seen through to show the internal structure of the light emitting device.

As shown in FIGS. 1 to 3, for example, a light emitting device 1 according to one embodiment includes a base member 10, at least a light emitting element 20, at least an electronic component 30, a first frame 41, a second frame 42, a first member 51 and a second member 52.

The base member 10 is an insulating member having a flat plate shape. The base member 10 has a first surface 10a on which a wiring pattern 14 is formed. The first surface 10a includes a first region 11 and a second region 12 as shown in FIG. 4. The first region 11 is a region in which the light emitting elements 20 are mounted, and the second region 12 is a region in which the electronic components 30 are mounted. As shown in FIGS. 2 and 3, the light emitting elements 20 and the electronic components 30 are mounted on the first region 11 and the second region 12, respectively, and electrically connected to the wiring pattern 14 of the base member 10.

The base member 10 is formed of, for example, a ceramic material such as alumina or aluminum nitride. The base member 10 may be formed using an electrically insulating resin material such as phenol resin, epoxy resin, polyimide resin, BT resin or polyphthalamide. The wiring pattern 14 is formed using an electrically conductive material, such as gold, silver, copper or aluminum. The base member 10 may be configured with a metal member and an insulating member that is provided on a surface of the metal member in a layered structure, and in this case, the wiring pattern 14 is formed on the insulating member.

The light emitting element 20 is, for example, a light emitting diode. The specific configuration of the light emitting element 20 may be appropriately determined as long as light having a predetermined wavelength can be emitted. For example, an LED chip housed in a package, or an LED chip alone (i.e., bare chip) may be employed as the light emitting element 20. It is desirable that the light emitting element 20 is a bare chip being flip-chip-mounted on the base member 10.

The wavelength of light that is emitted from the light emitting element 20 is appropriately set according to a use of the light emitting device 1. For example, the light emitting element 20 may contain a nitride-based semiconductor (In- $_X$Al$_Y$Ga$_{1-X-Y}$N, 0≤X, 0≤Y, X+Y≤1), and emit blue light. A plurality of light emitting elements 20 may be provided on the first region 11. In the light emitting device 1, a plurality of light emitting elements 20a to 20c is connected in series as shown in FIG. 3.

The electronic component 30 is, for example, a thermistor, a transistor, a rectifying diode or the like. For example, a semiconductor chip housed in a package, or a semiconductor chip alone (i.e., bare chip) may be employed as the electronic component 30. A plurality of electronic components 30 may be provided on the second region 12. As shown in FIG. 3, for example, a plurality of electronic components 30a to 30g are electrically connected to the wiring pattern 14 of the base member 10 directly or through a bonding wire W. For example, a plurality of electronic components 30a to 30g may be bare chips that respectively are a thermistor, a transistor and a rectifying diode. As shown in FIG. 3, a portion of the electronic component 30 may be covered with the second frame 42.

The first frame 41 and the second frame 42 are provided on the base member 10. The first frame 41 surrounds the first region 11, and the second frame 42 surrounds the second region 12. That is, the light emitting elements 20 provided on the first region 11 are surrounded by the first frame 41. The electronic components 30 provided on the second region 12 are surrounded by the second frame 42. The first frame 41 and the second frame 42 are non-light-transmissive. In the first light emitting device 1, a part of the frame 41 and a part of the second frame 42 are integrated with each other as shown in FIG. 2. That is, the first frame 41 and the second frame 42 share a part of each other.

The first member 51 is provided inside the first frame 41, and covers or encapsulates a plurality of light emitting elements 20. An upper surface of the first member 51 is positioned higher than an upper surface of the first frame and an upper surface of the second frame, and constitutes a light emitting surface of the light emitting device 1. The first member 51 has light-transmissivity so as to transmit light emitted from the light emitting element 20. The second member 52 is provided inward of the second frame 42, and covers or encapsulates a plurality of electronic components 30 and the bonding wires. The second member 52 is non-light-transmissive.

The first frame 41, the second frame 42, the first member 51 and the second member 52 contain, for example, a resin. As the resin, phenyl silicone resin, dimethyl silicone resin or the like can be used. The specific compositions of the first frame 41, the second frame 42, the first member 51 and the second member 52 may be the same or different.

In the first frame 41, the second frame 42, and the second member 52, a pigment may be added to impart non-light-transmissivity. For example, in the first frame 41, the second frame 42, and the second member 52, a white pigment or the like may be added to the resin for enhancing the reflectivity. As the white pigment, titanium oxide or alumina may be used.

The first member 51 may contain a fluorescent material. The fluorescent material is excited by light emitted by the light emitting element 20, and emits light having a wavelength different from the wavelength of light emitted by the light emitting element 20. As the fluorescent material, a YAG-based fluorescent material, a β-SiAlON-based fluorescent material, a KSF-based fluorescent material or the like can be used. As one example, the light emitting element 20 emits blue light, and the first member 51 contains a YAG fluorescent material that emits yellow light. In this case, white light is emitted from the upper surface (i.e., light emitting surface) of the first member 51. As another example, the light emitting element 20 emits blue light, and the first member 51 contains a nitride fluorescent material that emits red light, and a YAG fluorescent material that emits yellow light. In this case, light having a color such as red or amber is emitted from the light emitting surface.

Figure 5:
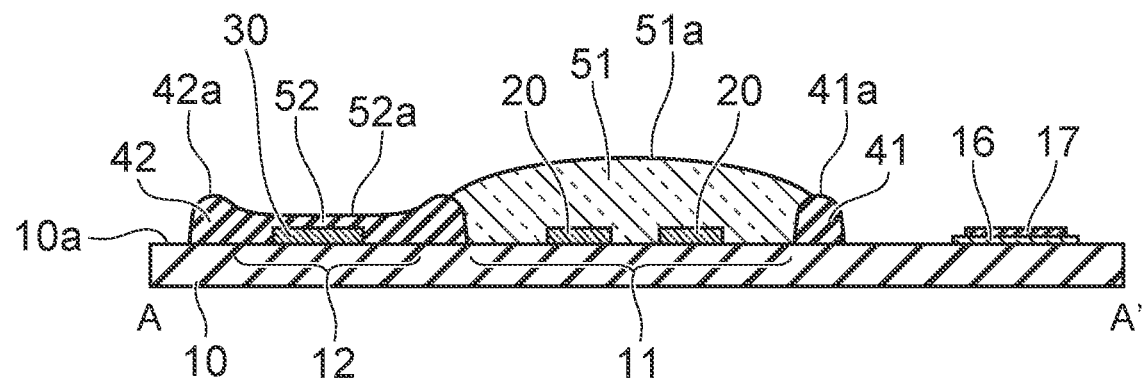
FIG. 5 is a sectional view taken along line A-A' in FIG. 2.

FIG. 5 is a sectional view taken along line A-A' in FIG. 2.

Figure 6:
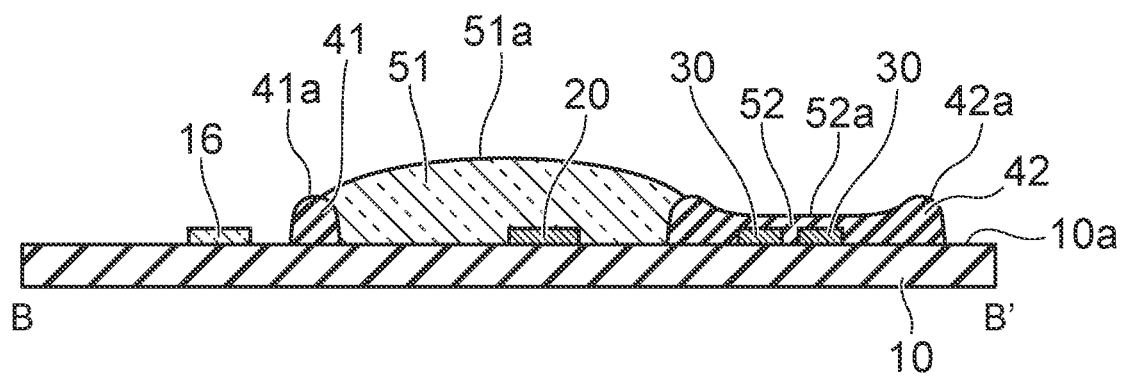
FIG. 6 is a sectional view taken along line B-B' in FIG. 2.

FIG. 6 is a sectional view taken along line B-B' in FIG. 2.

As shown in FIGS. 5 and 6, an upper surface 51a of the first member 51 is positioned higher than an upper surface 41a of the first frame 41, an upper surface 42a of the second frame 42, and an upper surface 52a of the second member 52. The upper surface 52a of the second member 52 may be flush with the upper surface 41a of the first frame 41 and the upper surface 42a of the second frame 42, or may be positioned lower than these upper surfaces as shown in FIGS. 5 and 6.

The light emitting device 1 is produced by, for example, the following method.

The light emitting elements 20 and the electronic components 30 are mounted on the base member 10 provided with the wiring pattern 14. Subsequently, an uncured resin material is disposed on the base member 10 in such a manner as to surround the light emitting elements 20 and the electronic components 30, and cured to form the first frame 41 and the second frame 42. Specifically, the first frame 41 and the second frame 42 are formed by, for example, setting a needle of a resin discharging apparatus above the base member 10, and moving the needle while discharging the uncured resin material from the tip of the needle onto the base member 10. The uncured resin material discharged from the needle is wetted and spread on the base member 10 to form the first frame 41 and the second frame 42, which have a substantially semicircular shape in a sectional view.

Subsequently, a light-transmissive resin material to be the first member 51 is poured inside the first frame 41, and a non-light-transmissive resin material to be the second member 52 is poured inside the second frame 42. These resins are cured to form the first member 51 and the second member 52, so that the light emitting element 20 and the electronic component 30 are encapsulated. The first member 51 may be formed before or after forming the second member 52.

Effects of the embodiments will next be described.

In the light emitting device 1 according to one embodiment, the upper surface 51a of the first member 51 that covers the light emitting element 20 is positioned higher than the upper surface 41a of the first frame 41, the upper surface 42a of the second frame 42 and the upper surface 52a of the second member 52 as shown in FIGS. 5 and 6. Light emitted from the light emitting element 20 is extracted from the upper surface 51a of the first member 51. The upper surface 51a is positioned higher than the upper surfaces 41a, 42a and 52a of other members, thus the extracted light is less likely to be reflected or absorbed by other members. As a result, light emitted from the light emitting element 20 can be efficiently extracted outside. That is, according to this embodiment, the light extraction efficiency of the light emitting device 1 can be improved.

In the light emitting device 1, it is desirable that the area of the second region 12 on which the electronic component 30 be larger than the area of the first region 11 on which the light emitting element 20 is mounted. This is because the second region 12 having a larger area than the area of the first region 11 can allow a larger number of electronic components 30 to be mounted on the second region 12.

With the second region 12 having a large area, a plurality of electronic components 30 can be mounted on a plane surface without overlapping the electronic components 30 on one another even if the light emitting device 1 includes a large number of electronic components 30. Accordingly, the upper surface 52a of the second member 52 covering the electronic component 30 can be at a lower position. Locating the upper surface 52a at the lower position can make the upper surface 51a of the first member 51 to be at a lower position necessary to satisfy the above-described relationship. As a result, the height of the light emitting device 1 can be reduced, so that the light emitting device 1 can be reduced in size.

Regarding the first frame 41 and the second frame 42, it is desirable that a part of the first frame 41 and a part of the second frame 42 be integrated with each other as shown in FIG. 2. With this configuration, the area occupied by the first frame 41 and the second frame 42 can be reduced on the base member 10, so that the light emitting device 1 can be reduced in size.

It is desirable that the electronic components 30 and the base member 10 (substantially the wiring pattern 14) be electrically connected to each other using a bonding wires W. By connecting the electronic components 30 and the wiring pattern 14 to each other with the bonding wires W, the flexibility of arrangement of the electronic component 30 can be improved, so that the electronic component 30 can be efficiently arranged on the second region 12.

It is desirable that the upper surface 52a of the second member 52 be positioned lower than the upper surface 41a of the first frame 41 and the upper surface 42a of the second frame 42. With this configuration, the volume per unit area of the second member 52 inside the second frame 42 can be decreased. When the temperature of the light emitting device 1 increases or decreases, the temperature of the second member 52 is changed, and at this time, the volume of the second member 52 is changed according to the temperature change. Decrease in the volume of the second member 52 can decrease the amount change of the volume of the second member 52 due to a temperature change, so that stress applied to the electronic component 30 can be reduced. As a result, damage to the electronic component 30 and occurrence of connection failure can be attenuated, to thereby improve the reliability of the light emitting device 1.

In particular, when the bonding wire W is used, it is desirable that the second member 52 have a small volume. Decrease in the volume change of the second member 52 due to a temperature change can reduce the possibility of breakage occurrence of the bonding wire W, thus the reliability of the light emitting device 1 can further be improved.

Preferably, the light emitting element 20 is flip-chip-mounted on the base member 10. With flip-chip-mounting, electrodes of the light emitting elements 20 and conductive wiring on the base member are electrically connected to each other using a paste-like bonding member having electrical conductivity, such as solder, a thin film-like or bump-like bonding member, or the like.

It is desirable that the electronic component 30 be a bare chip of one of a thermistor, a transistor and a diode. Using a bare chip can reduce the proportion of the area that the electronic component 30 occupies on the base member 10, as compared to a case in which a packaged component is used. In addition, using a bare chip can allow the second member 52 to easily embed the electronic components, so that the light emitting device 1 can be reduced in size.

In addition, the second frame 42 has a plurality of corner portions C. In other words, the second frame 42 has a polygonal shape constituted by a plurality of straight-line portions and curved line portions in a top view. It is desirable that the interior angle of the corner portion C be 90 degrees or more as shown in FIGS. 2 and 3.

As described above, the second member 52 is formed by pouring an uncured resin material inward of the second frame 42, and curing the resin material. At this time, in the case where the interior angle of the corner portion C is less than 90 degrees, the uncured resin material easily runs onto the second frame 42 at the corner portion C. That is, there is a possibility that the upper surface 52a of the second member 52 is positioned higher than other portions at the corner portion C. When the position of the upper surface 52a partially rises, the upper surface 51a is required to be higher than the rising part of the upper surface 52a, resulting in increase of size of the light emitting device 1.

When the interior angle of the corner portion C is 90 degrees or more, the resin material is easily drawn off at the corner portion C, so that rising of the position of the upper surface 52a at the corner portion C can be suppressed. As a result, rising of the position of the upper surface 51a is also suppressed, so that the light emitting device 1 can be reduced in size.

Similarly, it is desirable that the shape of the first frame 41 be a polygonal shape with four or more sides, or a substantially elliptical shape. Accordingly, the resin material is easily sunk in formation of the first member 51, thereby attenuating rise of the upper surface 51a of the first member 51, so that the light emitting device 1 can be reduced in size.

When at least one of the first frame 41 and the second frame 42 has a polygonal shape, the tips of corner portions of the polygonal shape may have a rounded shape due to spreading of the resin material discharged onto the base member.

As shown in FIGS. 1 to 3, printed resistors 15a to 15c, a protective glass 16, a protective resin 17, an electronic component 18a, an electronic component 18b and the like are further provided on the base member 10. As shown in FIG. 3, the printed resistors 15a to 15c are printed on the first surface 10a of the base member 10, and connected between predetermined portions of the wiring pattern 14. As shown in FIG. 2, the protective glass 16 covers a part of the wiring pattern 14 and the printed resistors 15a to 15c. The protective resin 17 is provided on the protective glass 16 in such a manner as to overlap the printed resistors 15a to 15c.

The base member 10 is provided with pin holes 19a and 19b. At the time of mounting the light emitting device 1 in a socket or the like, an external plug (i.e., terminal) passes through each of the pin holes 19a and 19b to establish electrical connection to the wiring pattern 14. The electronic components 18a and 18b are electrically connected to the wiring pattern 14, and connected between a terminal on the pin hole 19a side and a terminal on the pin hole 19b side.

At this time, the first frame 41 is disposed at substantially the center of the base member 10, and the pin holes 19a and 19b are positioned in the vicinity of the outer edge of the base member. The second frame is disposed along an outer edge opposite to the outer edge positioned close to the pin holes 19a and 19b. Such configuration is preferable because the pin holes 19a and 19b which are electrical connection portions to the outside can be disposed separately from the electronic components, and therefore, for example, when a heat sink is disposed directly under the electronic component, the heat sink is easily separated from the external connection terminals.

Figure 7:
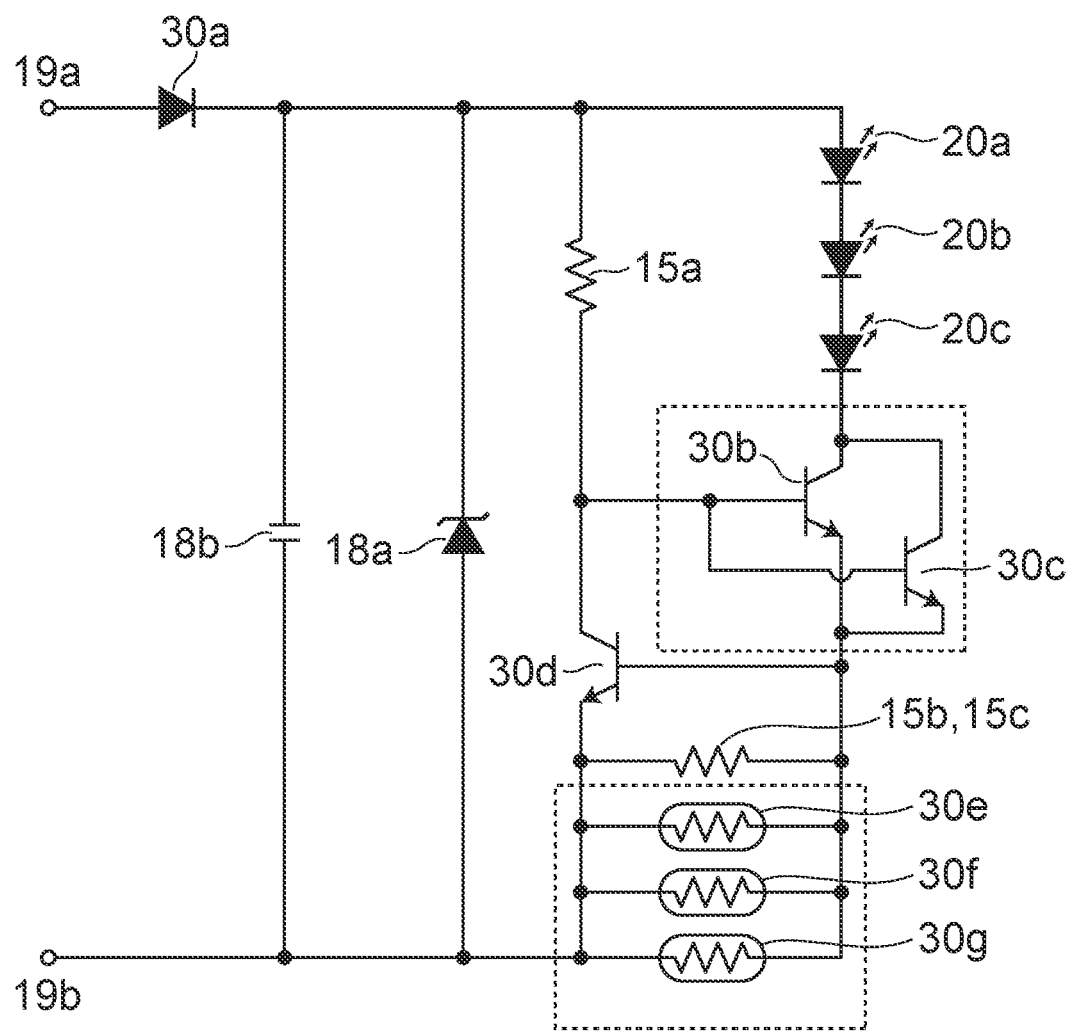
FIG. 7 is a circuit diagram illustrating a circuit configuration of the light emitting device according to the embodiment.

FIG. 7 is a circuit diagram illustrating a circuit configuration of the light emitting device according to the embodiment.

The light emitting device 1 has a circuit configuration as shown in, for example, FIG. 7. In the example shown in FIG. 7, three light emitting elements 20a to 20c, two printed resistors 15a to 15c, one protective element 18a, one capacitor 18b, one rectifying diode 30a, three transistors 30b to 30d and three thermistors 30e to 30g are provided.

In the light emitting device according to this embodiment, one rectifying diode 30a, three transistors 30b to 30d and three thermistors 30e to 30g are disposed as electronic components in the second frame 42.

For example, a positive electrode terminal is inserted into the pin hole 19a, and a negative electrode terminal is inserted into the pin hole 19b. The positive electrode terminal is connected to the rectifying diode 30a. On the negative electrode side of the rectifying diode, the light emitting elements 20a to 20c are connected to the printed resistor 15a in parallel. The negative electrode side of the light emitting elements 20a to 20c are connected to collectors of two transistors 30b and 30c. The transistors 30b and 30c are connected in parallel.

The negative electrode side of the printed resistor 15a is connected to bases of the transistors 30b and 30c. The negative electrode side of the printed resistor 15a is also connected to a collector of the transistor 30d. Emitters of the transistors 30b and 30c are connected to a base of the transistor 30d. The printed resistors 15b and 15c and the thermistors 30e to 30g are connected in parallel between the emitters of the transistors 30b and 30c and an emitter of the transistor 30d. The emitter of the transistor 30d is connected to the negative electrode terminal.

Value of current passing through the light emitting device 1 is determined by voltage between the base and the emitter (i.e., base-emitter voltages $V_{BE}$) of the transistors 30b to 30d, electric resistances of the printed resistors 15b and 15c, and electric resistances of the thermistors 30e to 30g. As a current passes through the light emitting device 1, the temperatures of the transistors 30b and 30c are elevated, and the voltage $V_{BE}$ decreases. The thermistors 30e to 30g have inverse characteristics so as to compensate for a change of the voltage $V_{BE}$ due to a temperature change. That is, when the temperatures of the thermistors 30e to 30g are elevated, the electric resistances of the thermistors decrease. This can attenuate variance in a value of current passing through the light emitting device 1 even if the temperature of the light emitting device 1 is changed by heat generation. Parallel connection of a plurality of transistors, and parallel connection of a plurality of thermistors can allow a larger current to pass through the light emitting device 1.

The electronic component 18a and the electronic component 18b are further connected in parallel between the negative electrode side of the rectifying diode and the negative electrode terminal. The electronic component 18a is a Zener diode. In case of generation of a temporarily large voltage (i.e., surge) in the circuit, a current passes through the Zener diode, so that other electronic components can be protected from breakage. The electronic component 18b is a capacitor. Provision of the capacitor can attenuate passage of current noise components through the light emitting elements 20a to 20c.

The light emitting device 1 having the above-mentioned circuit configuration is used for, for example, lighting in direction indicators of vehicles, DRL (i.e., daytime running lamps) and the like. The circuit configuration shown in FIG. 7 is a merely example. The light emitting device 1 may have another circuit configuration. The circuit configuration of the light emitting device 1 can be appropriately changed according to a use application and the like of the light emitting device 1.

Modification

Figure 8:
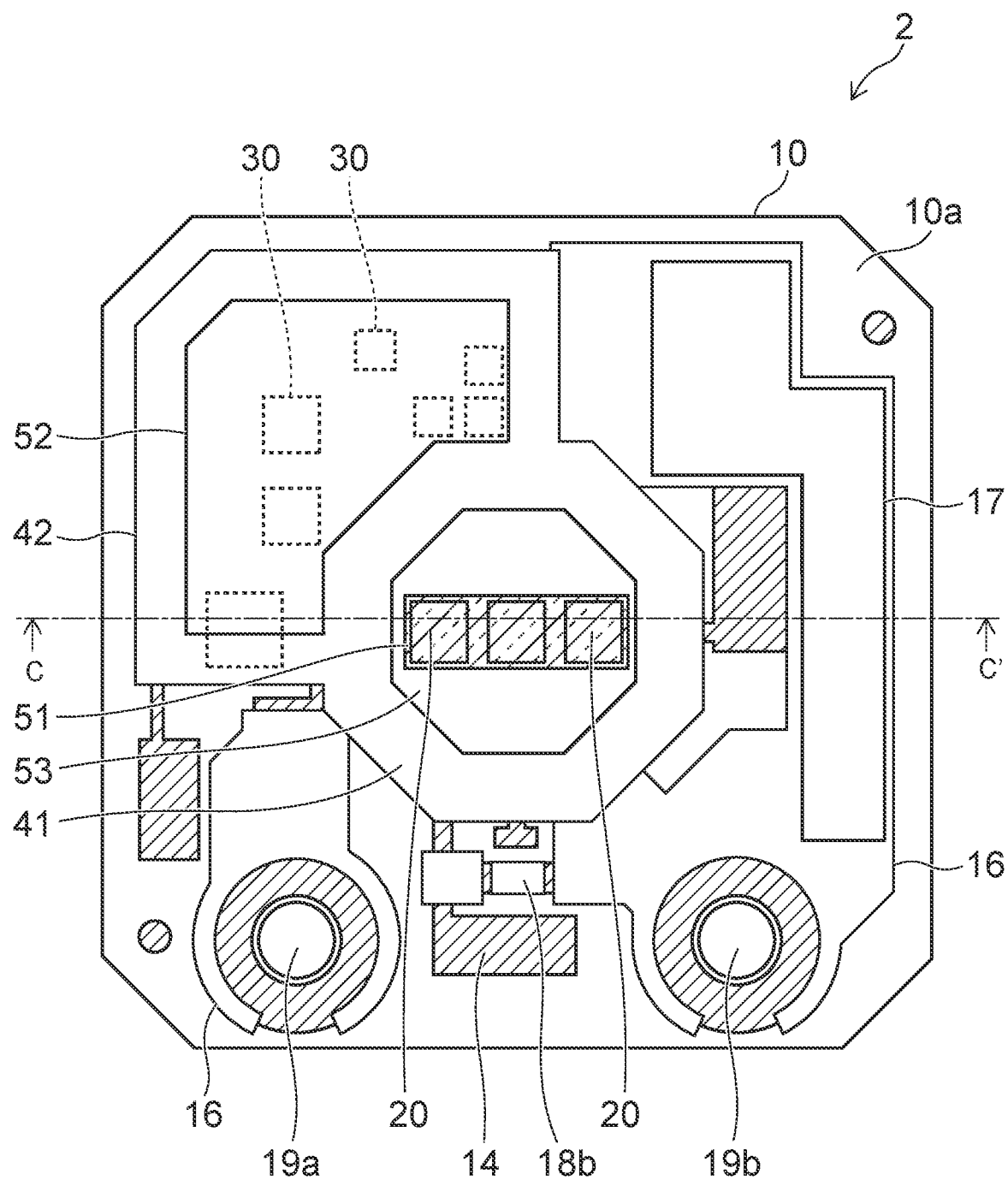
FIG. 8 is a top view illustrating a light emitting device according to a modification of the embodiment.
Figure 9:
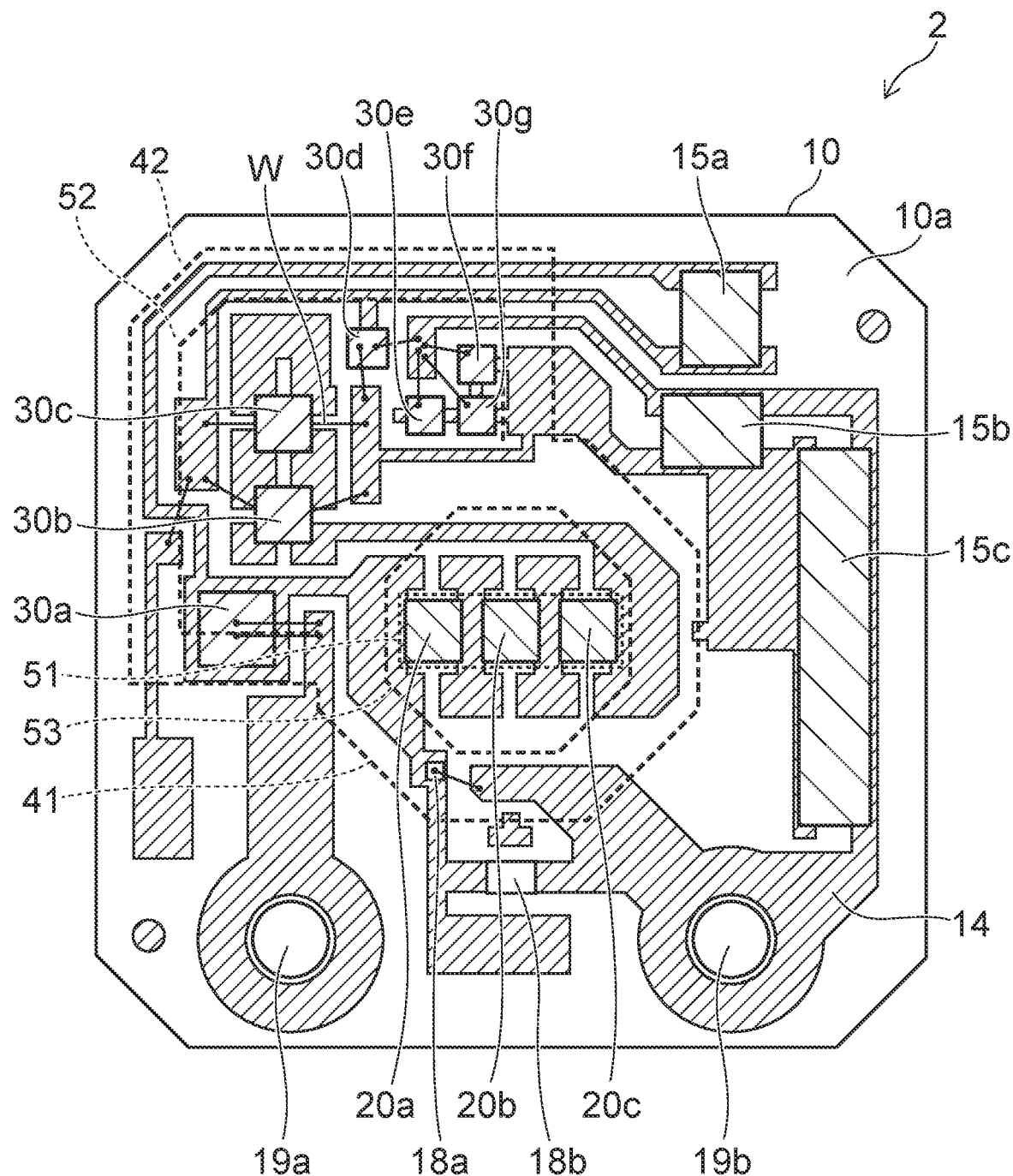
FIG. 9 is a top view illustrating the light emitting device according to the modification of the embodiment.

FIGS. 8 and 9 are top views illustrating a light emitting device according to a modification of the embodiment.

FIG. 9 is a diagram in which some constituent elements are omitted or seen through to show the internal structure of the light emitting device.

The light emitting device 2 shown in FIGS. 8 and 9 further includes a third member 53 covering lateral surfaces of a first member 51. The first member 51 and the third member 53 are provided on a base member 10 in a first region 11. The first member 51 is surrounded by the third member 53, and covers a plurality of light emitting elements 20. That is, the first member 51 is provided on the light emitting element 20 while being inward of a first frame 41, and the third member 53 is packed in other portions.

The first member 51 is light-transmissive, and the third member 53 is non-light-transmissive. The first member 51 has a plate shape, and is, for example, a glass plate. The glass plate may contain a fluorescent material, and/or may be colored. Alternatively, a material containing a fluorescent material may be formed on a surface of the glass plate by printing or the like. As other examples, the first member 51 may be a sintered body of a fluorescent material, a resin, a ceramic, or other inorganic substance, which contain a fluorescent material. The third member 53 contains, for example, a resin. The third member 53 may contain a white pigment in the same manner as the second member 52. Providing the first member 51 and the third member 53 in the first region 11 can define a light emitting surface (i.e. an upper surface of the first member 51) in a predetermined region, so that a range of light emission by the light emitting device 2 can be limited.

In the light emitting device 2, the shape of a first frame 41 in a top view is a polygonal shape with six or more sides (an octagonal shape in this example). The shape of the first frame 41 in a top view may be a circular shape as shown in FIGS. 1 to 3.

Figure 10:
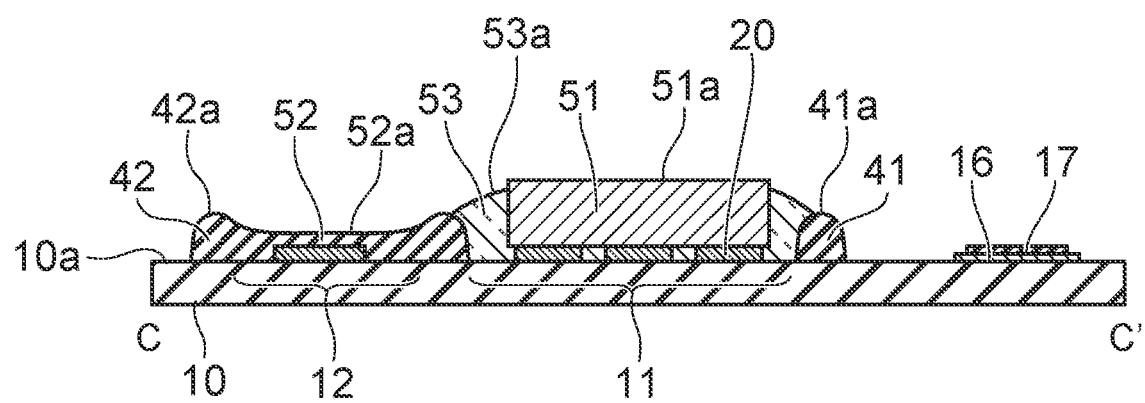
FIG. 10 is a sectional view taken along line C-C' in FIG. 8.

FIG. 10 is a sectional view taken along line C-C' in FIG. 8.

In the light emitting device 2, the upper surface 51a of the first member 51 is positioned higher than an upper surface 41a of the first frame 41, an upper surface 42a of a second frame 42, and an upper surface 52a of the second member 52 as shown in FIG. 10. The upper surface 51a is positioned higher than the upper surface 53a of the third member 53. This can improve light extraction efficiency of the light emitting device 2 as in the light emitting device 1. In this way, the specific configuration of the light emitting device can be appropriately changed as long as the upper surface 51a of the first member 51 and the upper surfaces of other members satisfy the above-described positional relationship.

The foregoing embodiment is an example of implementation of the present disclosure, and the scope of the present disclosure is not limited to the embodiment herein. Embodiments achievable with a design change made to the aforementioned embodiment as appropriate by those skilled in the art are within the scope of the present disclosure as long as they include the spirit of the present disclosure.

What is claimed is:

1. A light emitting device comprising:
    a base member having a first surface including a first region and a second region;
    a first frame provided on the base member and surrounding the first region;
    a light emitting element provided on the base member in the first region;
    a light-transmissive first member provided inward of the first frame, and covering the light emitting element;
    a plurality of electronic components provided on the base member in the second region and electrically connected with the light emitting element, wherein the plurality of electronic components includes a first electronic component and a second electronic component;
    a plurality of pin holes arrayed in a first direction and electrically connected with the plurality of electronic components, the first direction being orthogonal to a thickness direction of the base member, the plurality of pin holes penetrating the base member along the thickness direction;
    a resistor provided on the base member; and
    a resin overlapping the resistor in a top view;
    wherein the first electronic component is provided on a side opposite the plurality of pin holes with respect to the light emitting element in a second direction that is orthogonal to the thickness direction and the first direction, and
    wherein the second electronic component is aligned with the light emitting element in the first direction.

2. The light emitting device according to claim 1, wherein an upper surface of the first member is positioned higher than an upper surface of the first frame.

3. The light emitting device according to claim 1, further comprising:
    a second frame provided on the base member and surrounding the second region; and
    a non-light-transmissive second member provided inward of the second frame, and covering the plurality of electronic components.

4. The light emitting device according to claim 3, wherein
    a part of the first frame and a part of the second frame are integrated with each other; and
    an upper surface of the first member is positioned higher than an upper surface of the first frame, an upper surface of the second frame, and an upper surface of the second member.

5. The light emitting device according to claim 3, wherein an upper surface of the second member is positioned lower than an upper surface of the first frame and an upper surface of the second frame.

6. The light emitting device according to claim 1, wherein the plurality of electronic components includes a bare chip of at least one of a thermistor, a transistor, or a rectifying diode.

7. The light emitting device according to claim 1, wherein the plurality of electronic components includes a bare chip of a thermistor.

8. The light emitting device according to claim 1, wherein the first member contains a fluorescent material.

9. The light emitting device according to claim 1, wherein the plurality of electronic components includes a thermistor, a transistor, and a rectifying diode.

10. The light emitting device according to claim 9, wherein:
    the plurality of pin holes includes a first pin hole and a second pin hole; and
    a distance between the first pin hole and the thermistor is longer than a distance between the second pin hole and the thermistor.

11. The light emitting device according to claim 9, wherein:
    the plurality of pin holes includes a first pin hole and a second pin hole; and
    a distance between the first pin hole and the transistor is longer than a distance between the second pin hole and the transistor.

12. The light emitting device according to claim 9, wherein:
    the plurality of pin holes includes a first pin hole and a second pin hole; and
    a distance between the first pin hole and the rectifying diode is longer than a distance between the second pin hole and the rectifying diode.

13. The light emitting device according to claim 9, wherein:
    the plurality of pin holes includes a first pin hole and a second pin hole;
    a distance between the first pin hole and the thermistor is longer than a distance between the second pin hole and the thermistor;
    a distance between the first pin hole and the transistor is longer than a distance between the second pin hole and the transistor; and
    a distance between the first pin hole and the rectifying diode is longer than a distance between the second pin hole and the rectifying diode.

14. The light emitting device according to claim 1, wherein:
    the light emitting element is positioned between the resistor and the second electronic component in the first direction.

15. The light emitting device according to claim 1, wherein:
    the first electronic component is a thermistor.

16. The light emitting device according to claim 1, wherein:
    the second electronic component is a rectifying diode.

17. The light emitting device according to claim 1, wherein:
    the first electronic component is a thermistor; and
    the second electronic component is a rectifying diode.

18. The light emitting device according to claim 1, further comprising:
    a third electronic component located between the first electronic component and the second electronic component.

19. The light emitting device according to claim 18, wherein:
    the third electronic component is a transistor.

20. The light emitting device according to claim 18, wherein:
    the first electronic component is a thermistor;
    the second electronic component is a rectifying diode; and
    the third electronic component is a transistor.

* * * * *